(12) United States Patent
Jacobs et al.

(10) Patent No.: US 7,061,291 B2
(45) Date of Patent: Jun. 13, 2006

(54) LINEAR VOLTAGE TRACKING AMPLIFIER FOR NEGATIVE SUPPLY SLEW RATE CONTROL

(75) Inventors: Karl H. Jacobs, Pleasant Valley, CT (US); Robert Neidorff, Bedford, NH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/743,171

(22) Filed: Dec. 22, 2003

(65) Prior Publication Data

US 2005/0052209 A1    Mar. 10, 2005

Related U.S. Application Data

(60) Provisional application No. 60/501,006, filed on Sep. 8, 2003.

(51) Int. Cl.
*H03K 5/12* (2006.01)

(52) U.S. Cl. .......................... 327/170; 327/95
(58) Field of Classification Search ................ 327/100, 327/103, 112, 134, 170, 94, 95
See application file for complete search history.

(56) References Cited

U.S. PATENT DOCUMENTS 3,581,226 A * 5/1971 Perkins et al. .............. 330/253
3,986,132 A * 10/1976 Wittlinger .................. 330/297
4,683,443 A * 7/1987 Young et al. ............... 330/277
5,153,469 A * 10/1992 Petted et al. ................ 327/113
6,201,455 B1 * 3/2001 Kusunoki ................... 333/103
6,597,240 B1   7/2003 Walburger et al. ........... 330/10

* cited by examiner

*Primary Examiner*—Timothy P. Callahan
*Assistant Examiner*—An T. Luu
(74) *Attorney, Agent, or Firm*—W. James Brady, III; Frederick J. Telecky, Jr.

(57) ABSTRACT

Circuitry is provided for controlling the slew rate of a negative output supply. The slew rate control circuitry includes an NMOS FET, a feedback resistor connected across the drain and the gate of the NMOS FET, an input resistor connected to the gate of the NMOS FET, level shifting circuitry connected between a positive output supply voltage and the input resistor, and a bias current source connected to the gate of the NMOS FET. A negative input supply voltage is connected to the source of the NMOS FET, and the negative output supply voltage is provided across a load connected to the drain of the NMOS FET. As the positive supply voltage ramps up from 0 to $+V_S$, the level shifter provides a voltage to the input resistor that ramps up from $-V_S$ to 0 volts. Further, the drain voltage of the NMOS FET ramps down from 0 to $-V_S$, thereby providing a negative output supply voltage $-V_S$ with a slew rate that linearly tracks the slew rate of the master positive output supply.

30 Claims, 3 Drawing Sheets

LINEAR VOLTAGE TRACKING AMPLIFIER FOR NEGATIVE SUPPLY SLEW RATE CONTROL

CROSS REFERENCE TO RELATED APPLICATIONS

This application claims priority of U.S. Provisional Patent Application No. 60/501,006 filed Sep. 8, 2003 entitled LINEAR VOLTAGE TRACKING AMPLIFIER FOR NEGATIVE SUPPLY SLEW RATE CONTROL.

STATEMENT REGARDING FEDERALLY SPONSORED RESEARCH OR DEVELOPMENT

N/A

BACKGROUND OF THE INVENTION

The present application relates generally to slew rate control circuitry, and more specifically to circuitry for controlling the slew rate of switched power supplies.

Slew rate control circuitry is frequently employed in conjunction with switched power supplies. For example, the slew rate of a switched power supply on a mother printed circuit (PC) card is often controlled to limit the in-rush current charging bulk decoupling capacitors on one or more daughter PC cards. Such slew rate control of the mother PC card power supply is necessary because excessive in-rush current can (1) adversely affect the operation of the switched power supply, (2) trigger unwanted system resets, and/or (3) disrupt system processor operation.

A conventional approach for controlling the slew rate of a switched power supply employs a source-follower circuit configuration, in which a capacitor is connected to the gate of a Field Effect Transistor (FET), an input supply voltage is connected to the drain of the FET, and an output supply voltage is provided across a load connected to the source of the FET. The capacitor is charged by a constant current to provide a linear voltage ramp to the gate of the FET. Because the voltage on the source of the FET follows the linear voltage ramp on the gate of the FET, slew rate control of the output supply voltage is achieved. In the event it is desired to control the slew rate of a positive output supply voltage, the source-follower typically includes an NMOS FET. In the event the slew rate of a negative output supply voltage is to be controlled, the source-follower typically includes a PMOS FET.

Although the conventional source-follower circuit configuration described above has been successfully employed to control the slew rate of switched power supplies, the source-follower approach has several drawbacks. For example, the source-follower requires a charging capacitor, which can be bulky and expensive. Further, when controlling the slew rate of a negative output supply voltage, the source-follower requires a PMOS FET, which can also be an expensive circuit component.

Instead of using a PMOS FET to control the slew rate of the negative output supply, an NMOS FET may be employed. For example, another conventional circuit configuration has the negative input supply voltage connected to the source of the NMOS FET, the negative output supply voltage provided across a load connected to the drain of the NMOS FET, and a Miller capacitor connected between the gate and the drain of the NMOS FET. As in the conventional source-follower circuit configuration, a constant current source is used to charge the Miller capacitor. However, this alternative circuit configuration also has drawbacks due at least in part to the bulky and expensive Miller capacitor.

It would therefore be desirable to have circuitry for controlling the slew rate of switched power supplies that avoids the drawbacks of the above-described circuit configurations.

BRIEF SUMMARY OF THE INVENTION

In accordance with the present invention, circuitry is provided for controlling the slew rate of a negative output supply that requires neither an external capacitor nor a PMOS FET and therefore has reduced cost. Benefits of the presently disclosed slew rate control circuitry are achieved by employing an NMOS FET in a closed loop circuit configuration, in which the slew rate of the negative output supply linearly tracks the slew rate of a master positive output supply.

In one embodiment, the slew rate control circuitry includes an NMOS FET, a feedback resistor having first and second terminals connected between the drain and the gate of the NMOS FET, the first terminal of the feedback resistor being connected to the drain of the NMOS FET, an input resistor connected to the second terminal of the feedback resistor, level shifting circuitry connected between the positive output supply voltage and the input resistor, and a bias current source connected to the gate of the NMOS FET. Further, a negative input supply voltage is connected to the source of the NMOS FET, and the negative output supply voltage is provided across a load connected to the drain of the NMOS FET.

In the presently disclosed embodiment, the master positive supply voltage is controlled to ramp from 0 to $+V_S$ volts. As the positive supply voltage ramps from 0 to $+V_S$, the level shifter provides a voltage to the input resistor that ramps from $-V_S$ to 0 volts. Because the gate voltage of the NMOS FET remains substantially constant as the voltage applied to the input resistor ramps from $-V_S$ to 0 volts, the drain voltage of the NMOS FET ramps from 0 to $-V_S$, thereby providing a negative output supply voltage $-V_S$ with a slew rate that linearly tracks the slew rate of the master positive output supply. The level of the bias current source is selected so that the level of the node between the input resistor and the feedback resistor is within the normal active operating region of the NMOS FET.

Because of the closed loop circuit formed by the NMOS FET and the feedback resistor, the presently disclosed slew rate control circuitry provides a negative output supply with a slew rate that linearly tracks the slew rate of a master positive output supply.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which.

DETAILED DESCRIPTION OF THE INVENTION

U.S. Provisional Patent Application No. 60/501,006 filed Sep. 8, 2003 Attorney Docket No. TI-36859 (UNITI-173XX) entitled LINEAR VOLTAGE TRACKING AMPLIFIER FOR NEGATIVE SUPPLY SLEW RATE CONTROL is incorporated herein by reference.

Circuitry is disclosed for controlling the slew rate of a negative output supply. The presently disclosed slew rate control circuitry includes a closed loop circuit configuration that allows the slew rate of the negative output supply to linearly track the slew rate of a master positive output supply.

Figure 1:
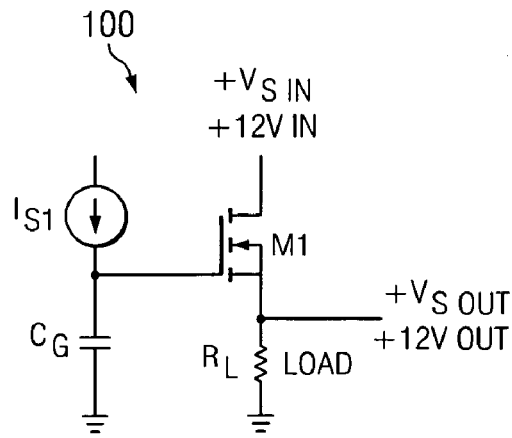
FIG. 1 is a schematic diagram of a first conventional slew rate control circuit configuration.

FIG. 1 depicts conventional circuitry 100 for controlling the slew rate of a positive output supply. As shown in FIG. 1, the conventional slew rate control circuitry 100 employs a source-follower circuit configuration including an NMOS Field Effect Transistor (FET) $M_1$, a constant current source $I_{S1}$, a gate capacitor $C_g$, and a load resistor $R_L$. The capacitor $C_g$ is connected between the gate of the NMOS transistor $M_1$ and ground, a constant positive input supply voltage $+V_{Sin}$ (e.g., $+V_{Sin}=+12$ volts) is connected to the drain of the NMOS transistor $M_1$, and a positive output supply voltage $+V_{Sout}$ (e.g., $+V_{Sout}=+12$ volts) is provided across the load resistor $R_L$ connected between the source of the NMOS transistor $M_1$ and ground. The current source $I_{S1}$ provides a constant current to charge the capacitor $C_g$, thereby providing a linear voltage ramp to the gate of the NMOS transistor $M_1$. Slew rate control of the positive output supply is achieved because the positive output voltage $+V_{Sout}$ on the source of the NMOS transistor $M_1$ follows the linear voltage ramp on the gate of the transistor $M_1$.

Those of ordinary skill in this art will appreciate that a source-follower circuit analogous to the slew rate control circuitry 100 for controlling the slew rate of a negative output supply typically includes at least one PMOS transistor (not shown). Such conventional source-follower circuit configurations have drawbacks, however, due at least in part to the bulky and expensive external capacitors and costly PMOS transistors.

Figure 2:
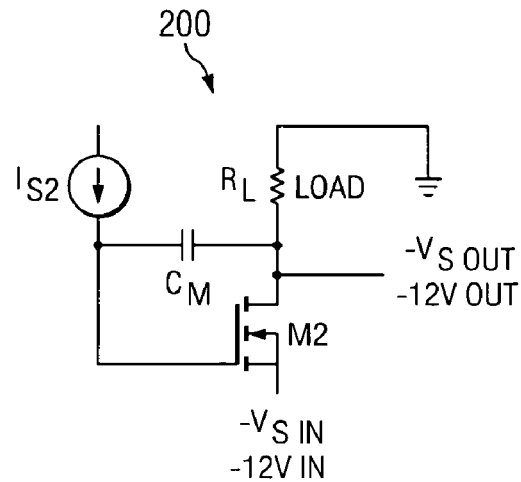
FIG. 2 is a schematic diagram of a second conventional slew rate control circuit configuration.

FIG. 2 depicts conventional circuitry 200 for controlling the slew rate of a negative output supply. As shown in FIG. 2, the conventional slew rate control circuitry 200 includes an NMOS transistor $M_2$, a constant current source $I_{S2}$, a Miller capacitor $C_M$, and a load resistor $R_L$. The Miller capacitor $C_M$ is connected between the gate and the drain of the NMOS transistor $M_2$, a constant negative input supply voltage $-V_{Sin}$ (e.g., $-V_{Sin}=-12$ volts) is connected to the source of the NMOS transistor $M_2$, and a negative output supply voltage $-V_{Sout}$ (e.g., $-V_{Sout}=-12$ volts) is provided across the load resistor $R_L$ connected between the drain of the NMOS transistor $M_2$ and ground. The current source $I_{S2}$ provides a constant current to the gate of the NMOS transistor $M_2$ and the Miller capacitor $C_M$ connected thereto, thereby controlling the slew rate of the negative output supply. The conventional slew rate control circuitry 200 also has drawbacks, however, due at least in part to the bulky and expensive Miller capacitor $C_M$.

Figure 3:
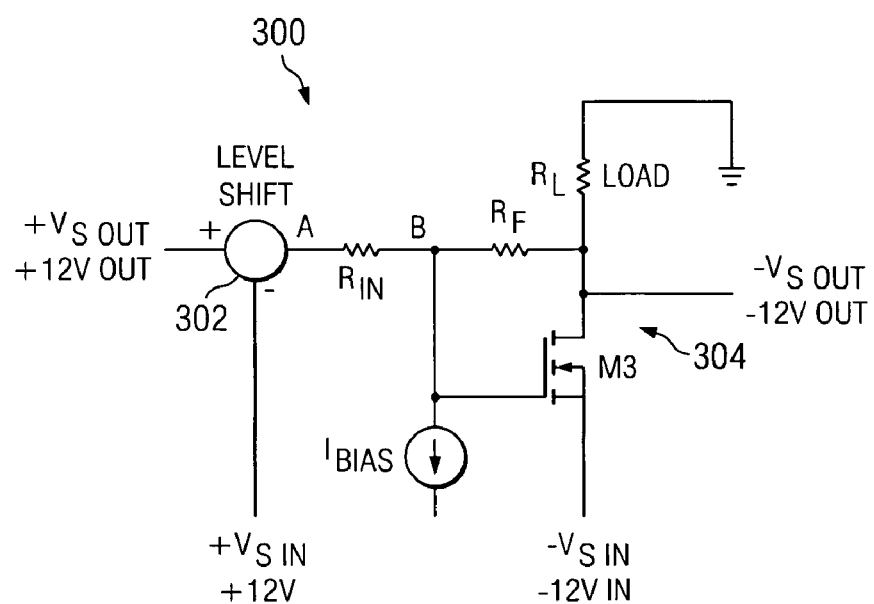
FIG. 3 is a schematic diagram of circuitry for controlling the slew rate of a negative output supply according to the present invention.

FIG. 3 depicts an illustrative embodiment of circuitry 300 for controlling the slew rate of a negative output supply, in accordance with the present invention. In the illustrated embodiment, the slew rate control circuitry 300 includes an NMOS FET $M_3$, level shifting circuitry 302, an input resistor $R_{IN}$, a feedback resistor $R_F$, a bias current source $I_{BIAS}$, and a load resistor $R_L$. A constant negative input supply voltage $-V_{Sin}$ (e.g., $-V_{Sin}=-12$ volts) is connected to the source of the NMOS transistor $M_3$, and the negative output supply voltage $-V_{Sout}$ (e.g., $-V_{Sout}=-12$ volts) is provided across the load resistor $R_L$ connected to the drain of the transistor $M_3$.

As shown in FIG. 3, a positive output supply voltage $+V_{Sout}$ (e.g., $+V_{Sout}=+12$ volts) is provided at a non-inverting input of the level shifter 302, and a constant positive input supply voltage $+V_{Sin}$ (e.g., $+V_{Sin}=+12$ volts) is provided at an inverting input of the level shifter 302. For example, the positive output supply voltage $+V_{Sout}$ may be generated from the positive input supply voltage $+V_{Sin}$ by the source-follower circuit 100 described above with reference to FIG. 1, or any other suitable circuit configuration. Accordingly, the positive output supply voltage applied to the level shifter 302 is controlled to ramp up from 0 to $+V_{Sout}$ volts.

Because the positive input supply voltage $+V_{Sin}$ is provided at the inverting input of the level shifter 302, the voltage applied to the input resistor $R_{IN}$ (node A) ramps up from $-V_S$ to 0 volts as the positive output supply voltage ramps up from 0 to $+V_S$. In the presently disclosed embodiment, the NMOS transistor $M_3$ is biased to maintain the transistor within its active operating region, and the level at node B between the input resistor $R_{IN}$ and the feedback resistor $R_F$ remains substantially constant at the threshold voltage of the transistor $M_3$, as the level at node A ramps up from $-V_S$ to 0 volts. The level of the bias current source $I_{BIAS}$ is selected to place the level at node B within the active operating region of the NMOS transistor $M_3$. Accordingly, to maintain the substantially constant voltage level at node B, the negative output supply voltage provided at the drain of the NMOS transistor $M_3$ ramps down from 0 to $-V_{Sout}$.

As a result, the slew rate of the negative output supply $-V_{Sout}$ linearly tracks the slew rate of the positive output supply $+V_{Sout}$. In effect, the positive output supply $+V_{Sout}$ is a "master" supply, and the slew rate of this master supply along with the closed loop gain set by the feedback resistor $R_F$ and the input resistor $R_{IN}$ determines the slew rate of the negative output supply $-V_{Sout}$.

It is noted that the slew rate control circuitry 300 provides closed loop control of the negative output supply slew rate. The output of the master positive supply is connected via the level shifter 302 to the input resistor $R_{IN}$, which functions as the input of a negative supply slew rate control loop 304. In the presently disclosed embodiment, the control loop 304 of the negative supply slew rate comprises the feedback resistor $R_F$ connected across the gate and the drain of the NMOS transistor $M_3$.

Figure 4:
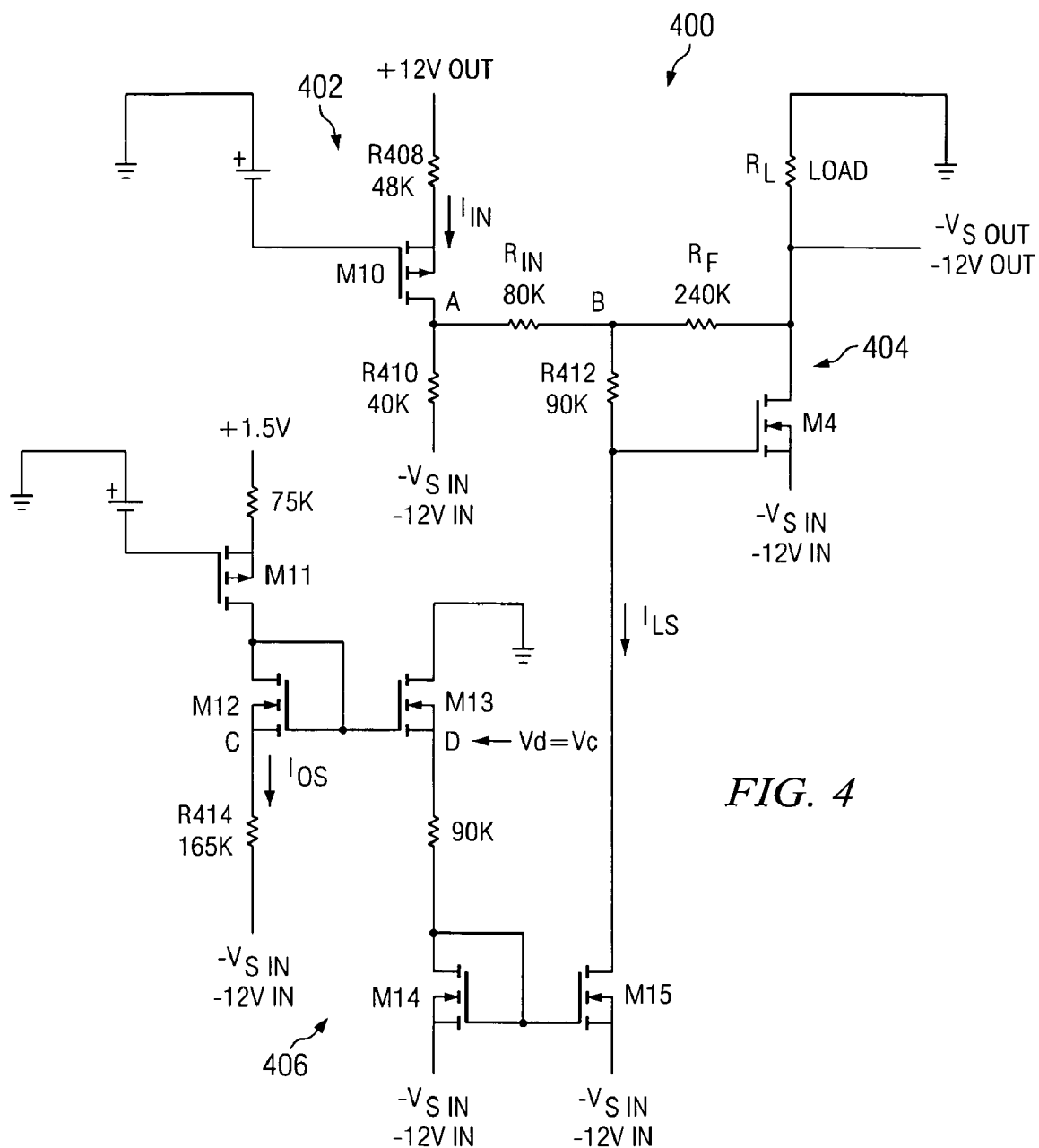
FIG. 4 is a detailed schematic diagram of the slew rate control circuitry of FIG. 3.

FIG. 4 depicts a more detailed embodiment 400 of the slew rate control circuitry 300 (see FIG. 3). In the illustrated embodiment, the slew rate control circuitry 400 comprises an NMOS FET $M_4$, level shifting circuitry 402, an input resistor $R_{IN}$ (e.g., $R_{IN}=80$ KΩ), a feedback resistor $R_F$ (e.g., $R_F=240$ KΩ), a bias current source 406, and a load resistor $R_L$. The constant negative input supply voltage $-V_{Sin}$ (e.g., $-V_{Sin}=-12$ volts) is connected to the source of the NMOS transistor $M_4$, and the negative output supply voltage $-V_{Sout}$ (e.g., $-V_{Sout}=-12$ volts) is provided across the load resistor $R_L$ connected to the drain of the transistor $M_4$.

As shown in FIG. 4, the positive output supply voltage $+V_{Sout}$ (e.g., $+V_{Sout}=+12$ volts) is provided at a resistor R408 (e.g., R408=48 KΩ) corresponding to the non-inverting input of the level shifter 402. Further, the constant negative input supply voltage $-V_{Sin}$ (e.g., $-V_{Sin}=-12$ volts) is provided at a resistor R410 (e.g., R410=40 KΩ) of the level shifter 402, thereby representing the positive input supply voltage $+V_{Sin}$ (e.g., $+V_{Sin}=+12$ volts) provided to the inverting input of the level shifter 302 of FIG. 3. As described above with reference to FIG. 3, the positive output supply is the master supply, which applies a voltage to the level shifter 402 that is controlled to ramp up from 0 to $+V_{Sout}$. The resistors 408 and 410 level shift this master ramp voltage from $+V_{Sout}$ to the common mode negative input supply voltage $-V_{Sin}$.

The slew rate control circuitry 400 further comprises a negative supply slew rate control loop 404 including the feedback resistor $R_F$ and a resistor R412 (e.g., R412=90 KΩ). It is noted that current summed at the input of the negative supply slew rate control loop 404 provides a "virtual node" as a swivel point. This current causes a voltage to develop across the resistor 412 to level shift the virtual node and to generate compensation for the gate-to-source voltage (Vgs) of the NMOS transistor $M_4$, thereby assuring ratio-metric control and a first-order cancellation of process and temperature variations of Vgs. The bias current source 406 comprises an NMOS current mirror configured to generate a current $I_{ls}$ for producing the compensating level shift voltage.

It is further noted that the NMOS transistor $M_4$ functions as a stable single gain stage within the slew rate control circuitry 400 (see FIG. 4). Accordingly, the NMOS transistor $M_4$ is operative to perform as a stable linear voltage tracking amplifier for controlling the slew rate of the negative output supply $-V_{Sout}$.

The following are representative expressions of the current ($I_{in}$) through the resistor R408, the voltage ($V_a$) at node A, the voltage ($V_b$) at node B, the current ($I_{OS}$) through the resistor R414, and the current ($I_{ls}$) generated by the NMOS current mirror:

$$I_{in} = +12V_{out}/48k \quad (1)$$

$$V_a = I_{in}(80k\|40k) = I_{in}(26.7k) \quad (2)$$

$$V_b = 1.5V(165k/75k), \text{ above } -12V_{in} \quad (3)$$

$$I_{OS} = 1.5V/75k \quad (4)$$

$$I_{ls} = [(1.5V/75k)*165k - Vgs]/90k \quad (5)$$

Moreover, the following are representative calculations relating to the gain and offset of the slew rate control circuitry 400:

GAIN:

$$I_{in} = (+12V_{out})/48k$$

$$Req = (80k\|40k) = 26.7k @ Va$$

$$V_a = (I_{in})(Req) = (+12V_{out})(26.7k/48k)$$

$$-V_{Sout} = -(Va/80k)(240k) \Leftrightarrow$$

$$-V_{Sout} = -3(+12V_{out})(26.7k/48k) \Leftrightarrow$$

$$-V_{Sout} \approx -1.5(+12V_{out}) \quad (6)$$

OFFSET:

$$I_{OS} = 1.5V/75k$$

$$V_d = V_c = I_{OS}(165k)$$

$$I_{ls} = (V_d - Vgs)/90k \Leftrightarrow$$

$$I_{ls} = [(1.5V/75k)*165k - Vgs]/90k$$

$$V_b = Vgs + I_{ls}(90k) \Leftrightarrow$$

$$V_b = 1.5V(165k/75k) \quad (7)$$

Figure 5:
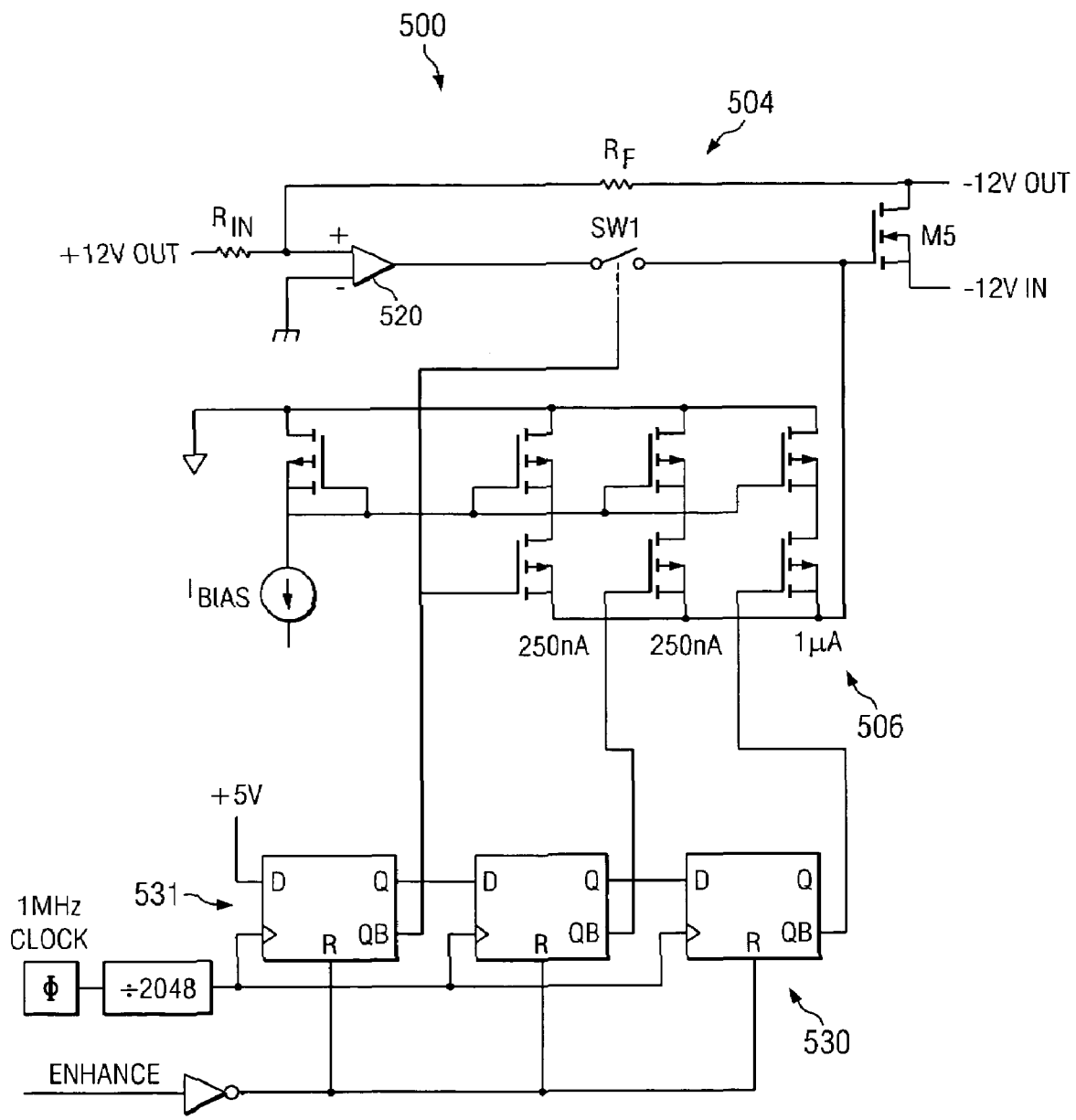
FIG. 5 is a schematic diagram of an alternative embodiment of the slew rate control circuitry of FIG. 4.

FIG. 5 depicts an alternative embodiment 500 of the slew rate control circuitry 400 (see FIG. 4). In the illustrated embodiment, the slew rate control circuitry 500 comprises an NMOS FET $M_5$, an input resistor $R_{IN}$, a feedback resistor $R_F$, a buffer 520, a controlled bias current source 506, and control logic 530. The constant negative input supply voltage $-V_{Sin}$ (e.g., $-V_{Sin}=-12$ volts) is connected to the source of the NMOS transistor $M_5$, and the negative output supply voltage $-V_{Sout}$ (e.g., $-V_{Sout}=-12$ volts) is provided at the drain of the transistor $M_5$. Moreover, a control loop 504 of the negative supply slew rate comprises the feedback resistor $R_F$, the buffer 520, and a switch SW1 connected between the output of the buffer 520 and the gate of the NMOS transistor $M_5$.

The operation of the switch SW1 and the bias current source 506 is controlled by the control logic 530. Specifically, when a logical high control signal is applied to an Enhance input, the control logic 530 is operative to open the switch SW1 as the level of the negative output supply voltage $-V_{Sout}$ ramps to a predetermined level of the negative input supply voltage $-V_{Sin}$, thereby disconnecting the slew rate control after the voltage ramp completes. It is noted that the slew rate control may be disconnected via the switch SW1 after the voltage ramp completes and after a predetermined time delay. Three stages of current (e.g., 250 nA, 250 nA, and 1 µA) are then applied to the gate of the NMOS transistor $M_5$ to ramp up the gate to 0 volts in a controlled manner. The control logic 530 includes a counter 531 operative to turn-on each current stage in predetermined increments of time, e.g., 2 msec steps.

For example, in a first step, 250 nA may be applied to the gate of the transistor $M_5$; in a second step, another 250 nA may be applied to the gate of the transistor $M_5$; and, in a third step 1 µA may be applied to the gate of the transistor $M_5$, thereby applying a total of 1.5 µA to the transistor gate. In effect, the bias current source 506 in conjunction with the control logic 530 functions as an overdrive circuit that is activated after the voltage ramp completes to provide an overdrive signal to the gate of the transistor in sequenced steps. This progressive application of current to the transistor gate via the overdrive signal avoids large in-rush current spikes on the negative input supply, while enhancing the NMOS transistor $M_5$ to reduce the on-resistance between the drain and source (Rdson) of the transistor and thus reduce the voltage drop across the negative supply interface.

It will further be appreciated by those of ordinary skill in the art that modifications to and variations of the above-described linear voltage tracking amplifier for negative supply slew rate control may be made without departing from the inventive concepts disclosed herein. Accordingly, the invention should not be viewed as limited except as by the scope and spirit of the appended claims.

What is claimed is:

1. A slew rate control circuit, comprising:
    an input voltage node;
    an output voltage node coupleable to a load;
    a first circuit node;
    a first transistor having a gate, a source, and a drain, the drain of the first transistor being coupled to the output voltage node, the source of the first transistor being coupleable to a first voltage source, wherein the first transistor is biased to operate within its active operating region;
a feedback resistor having first and second terminals coupled to the output voltage node and the first circuit node, respectively, the feedback resistor being connected between the gate and the drain of the first transistor; and
an input resistor having first and second terminals coupled to the second terminal of the feedback resistor and the input voltage node, respectively,
wherein the control circuit is operative to provide a ramped down voltage signal at the output voltage node that linearly tracks a first ramped up voltage signal applied to the input voltage node,
wherein the ramped down voltage signal provided at the output voltage node ramps down from 0 volts to a first negative voltage level, and
wherein the first voltage source is operative to provide a voltage level equal to the first negative voltage level.

2. The control circuit of claim 1 wherein the first transistor is an NMOS transistor.

3. The control circuit of claim 1 further including a bias current source coupled to the gate of the first transistor, the bias current source being operative to bias the first transistor within its active operating region.

4. The control circuit of claim 1 further including a controlled bias current source coupled to the gate of the first transistor, the controlled bias current source being operative to bias the first transistor within its active operating region by applying a controlled current to the gate of the first transistor.

5. The control circuit of claim 4 wherein the controlled bias current source is operative to apply the controlled current to the gate of the first transistor after the first ramped up voltage signal ramps to a predetermined voltage level, thereby reducing an on-resistance between the drain and the source of the first transistor.

6. The control circuit of claim 5 wherein the controlled bias current source is operative to apply the controlled current to the first transistor gate in sequenced steps.

7. The control circuit of claim 4 wherein the controlled bias current source is operative to apply the controlled current to the gate of the first transistor after the first ramped up voltage signal ramps to a predetermined voltage level and after a predetermined time delay, thereby reducing an on-resistance between the drain and the source of the first transistor.

8. The control circuit of claim 7 wherein the controlled bias current source is operative to apply the controlled current to the first transistor gate in sequenced steps.

9. The control circuit of claim 4 wherein the controlled bias current source is operative to sequentially increase a level of the controlled current applied to the first transistor gate from a first current level to at least one second current level greater than the first current level after the first ramped up voltage signal ramps to a predetermined voltage level.

10. The control circuit of claim 4 wherein a combination of the first transistor and the feedback resistor forms a closed control loop, and further including a controllable switch disposed within the control loop, the switch being controllable to open before the controlled current is applied to the gate of the first transistor by the controlled bias current source.

11. The control circuit of claim 1 further including a third resistor coupled between the first circuit node and the gate of the first transistor, wherein a voltage across the third resistor is operative to provide compensation for a voltage across the gate and the source of the first transistor.

12. A slew rate control circuit, comprising:
an input voltage node;
an output voltage node coupleable to a load;
a first circuit node;
a first transistor having a gate, a source, and a drain, the drain of the first transistor being coupled to the output voltage node, the source of the first transistor being coupleable to a first voltage source, wherein the first transistor is biased to operate within its active operating region;
a feedback resistor having first and second terminals coupled to the output voltage node and the first circuit node, respectively, the feedback resistor being connected between the gate and the drain of the first transistor; and
an input resistor having first and second terminals coupled to the second terminal of the feedback resistor and the input voltage node, respectively,
wherein the control circuit is operative to provide a ramped down voltage signal at the output voltage node that linearly tracks a first ramped up voltage signal applied to the input voltage node,
wherein the ramped down voltage signal provided at the output voltage node ramps down from 0 volts to a first negative voltage level, and
wherein the first ramped up voltage signal applied to the input voltage node ramps up from a second negative voltage level to 0 volts.

13. The control circuit of claim 12 wherein the first negative voltage level equals the second negative voltage level.

14. A slew rate control circuit, comprising:
an input voltage node;
an output voltage node coupleable to a load;
a first circuit node;
a first transistor having a gate, a source, and a drain, the drain of the first transistor being coupled to the output voltage node, the source of the first transistor being coupleable to a first voltage source, wherein the first transistor is biased to operate within its active operating region;
a feedback resistor having first and second terminals coupled to the output voltage node and the first circuit node, respectively, the feedback resistor being connected between the gate and the drain of the first transistor; and
an input resistor having first and second terminals coupled to the second terminal of the feedback resistor and the input voltage node, respectively,
wherein the control circuit is operative to provide a ramped down voltage signal at the output voltage node that linearly tracks a first ramped up voltage signal applied to the input voltage node,
further including level shifting circuitry coupled between the second terminal of the input resistor and the input voltage node,
wherein the level shifting circuitry is operative to level shift a second ramped up voltage signal applied to the input voltage node to the first ramped up voltage signal provided at the second terminal of the input resistor.

15. The control circuit of claim 14 wherein the second ramped up voltage signal applied to the input voltage node ramps up from 0 volts to a first positive voltage level.

16. A method of controlling a slew rate of an output supply, comprising the steps of:
providing a first transistor having a gate, a source, and a drain, the drain of the first transistor being coupled to an output voltage node, the source of the first transistor being coupleable to a first voltage source;
providing a feedback resistor having first and second terminals coupled to the output voltage node and a first circuit node, respectively, the feedback resistor being connected between the gate and the drain of the first transistor;
providing an input resistor having first and second terminals coupled to the second terminal of the feedback resistor and an input voltage node, respectively;
applying a first ramped up voltage signal to the input voltage node; and
providing a ramped down voltage signal at the output voltage node that linearly tracks the first ramped up voltage signal,
wherein the fourth providing step includes providing a ramped down voltage signal that ramps down from 0 volts to a first negative voltage level,
further including the step of providing a voltage level equal to the first negative voltage level by the first voltage source.

17. The method of claim 16 further including the step of biasing the first transistor to operate within its active operating region by a bias current source.

18. The method of claim 16 wherein the first transistor is an NMOS transistor.

19. The method of claim 16 wherein the applying step includes applying a first ramped up voltage signal ramps up from a second negative voltage level to 0 volts.

20. The method of claim 19 wherein the first negative voltage level equals the second negative voltage level.

21. A method of controlling a slew rate of an output supply, comprising the steps of:
providing a first transistor having a gate, a source, and a drain, the drain of the first transistor being coupled to an output voltage node, the source of the first transistor being coupleable to a first voltage source;
providing a feedback resistor having first and second terminals coupled to the output voltage node and a first circuit node, respectively, the feedback resistor being connected between the gate and the drain of the first transistor;
providing an input resistor having first and second terminals coupled to the second terminal of the feedback resistor and an input voltage node, respectively;
applying a first ramped up voltage signal to the input voltage node; and
providing a ramped down voltage signal at the output voltage node that linearly tracks the first ramped up voltage signal,
further including the step of providing level shifting circuitry coupled between the second terminal of the input resistor and the input voltage node,
further including the step of level shifting a second ramped up voltage signal applied to the input voltage node to the first ramped up voltage signal provided at the second terminal of the input resistor by the level shifting circuitry.

22. The method of claim 21 wherein the second ramped up voltage signal applied to the input voltage node ramps up from 0 volts to a first positive voltage level.

23. A method of controlling a slew rate of an output supply, comprising the steps of:
providing a first transistor having a gate, a source, and a drain, the drain of the first transistor being coupled to an output voltage node, the source of the first transistor being coupleable to a first voltage source;
providing a feedback resistor having first and second terminals coupled to the output voltage node and a first circuit node, respectively, the feedback resistor being connected between the gate and the drain of the first transistor;
providing an input resistor having first and second terminals coupled to the second terminal of the feedback resistor and an input voltage node, respectively;
applying a first ramped up voltage signal to the input voltage node; and
providing a ramped down voltage signal at the output voltage node that linearly tracks the first ramped up voltage signal,
further including the step of providing a third resistor coupled between the first circuit node and the gate of the first transistor.

24. The method of claim 23 wherein a voltage across the third resistor provides compensation for a voltage across the gate and the source of the first transistor.

25. A method of controlling a slew rate of an output supply, comprising the steps of:
providing a first transistor having a gate, a source, and a drain, the drain of the first transistor being coupled to an output voltage node, the source of the first transistor being coupleable to a first voltage source;
providing a feedback resistor having first and second terminals coupled to the output voltage node and a first circuit node, respectively, the feedback resistor being connected between the gate and the drain of the first transistor;
providing an input resistor having first and second terminals coupled to the second terminal of the feedback resistor and an input voltage node, respectively;
applying a first ramped up voltage signal to the input voltage node; and
providing a ramped down voltage signal at the output voltage node that linearly tracks the first ramped up voltage signal,
further including the steps of providing a controlled bias current source coupled to the gate of the first transistor, and applying a controlled current to the gate of the first transistor by the controlled bias current source to bias the first transistor within its active operating region,
wherein the second applying step includes applying the controlled current to the gate of the first transistor after the first ramped up voltage signal ramps to a predetermined voltage level, thereby reducing an on-resistance between the drain and the source of the first transistor.

26. The method of claim 25 wherein the second applying step includes applying the controlled current to the first transistor gate in sequenced steps.

27. The method of claim 25 wherein the second applying step includes sequentially increasing a level of the controlled current applied to the first transistor gate from a first current level to at least one second current level greater than the first current level after the first ramped up voltage signal ramps to a predetermined voltage level.

28. A method of controlling a slew rate of an output supply, comprising the steps of:
- providing a first transistor having a gate, a source, and a drain, the drain of the first transistor being coupled to an output voltage node, the source of the first transistor being coupleable to a first voltage source;
- providing a feedback resistor having first and second terminals coupled to the output voltage node and a first circuit node, respectively, the feedback resistor being connected between the gate and the drain of the first transistor;
- providing an input resistor having first and second terminals coupled to the second terminal of the feedback resistor and an input voltage node, respectively;
- applying a first ramped up voltage signal to the input voltage node; and
- providing a ramped down voltage signal at the output voltage node that linearly tracks the first ramped up voltage signal,
- further including the steps of providing a controlled bias current source coupled to the gate of the first transistor, and applying a controlled current to the gate of the first transistor by the controlled bias current source to bias the first transistor within its active operating region,
- wherein the second applying step includes applying the controlled current to the gate of the first transistor after the first ramped up voltage signal ramps to a predetermined voltage level and after a predetermined time delay, thereby reducing an on-resistance between the drain and the source of the first transistor.

29. The method of claim 28 wherein the second applying step includes applying the controlled current to the first transistor gate in sequenced steps.

30. A method of controlling a slew rate of an output supply, comprising the steps of:
- providing a first transistor having a gate, a source, and a drain, the drain of the first transistor being coupled to an output voltage node, the source of the first transistor being coupleable to a first voltage source;
- providing a feedback resistor having first and second terminals coupled to the output voltage node and a first circuit node, respectively, the feedback resistor being connected between the gate and the drain of the first transistor;
- providing an input resistor having first and second terminals coupled to the second terminal of the feedback resistor and an input voltage node, respectively;
- applying a first ramped up voltage signal to the input voltage node; and
- providing a ramped down voltage signal at the output voltage node that linearly tracks the first ramped up voltage signal,
- further including the steps of providing a controlled bias current source coupled to the gate of the first transistor, and applying a controlled current to the gate of the first transistor by the controlled bias current source to bias the first transistor within its active operating region,
- wherein a combination of the first transistor and the feedback resistor forms a closed control loop, and further including providing a controllable switch disposed within the control loop, the switch being controllable to open before the controlled current is applied to the gate of the first transistor by the controlled bias current source.

* * * * *